United States Patent [19]

Frey et al.

[11] Patent Number: 4,791,257
[45] Date of Patent: Dec. 13, 1988

[54] KEY ELEMENT FOR A CONTACTLESS KEYBOARD

[75] Inventors: Werner U. Frey, Thalwil; Johannes Rometsch, Rickenbach; Karl Iseli, Wädenswil; Peter Wild, Mettmenstetten, all of Switzerland

[73] Assignee: Alcatel N.V., Amsterdam, Netherlands

[21] Appl. No.: 484,804

[22] Filed: Apr. 14, 1983

[51] Int. Cl.[4] .............................................. H01H 9/00
[52] U.S. Cl. ............................... 200/159 R; 200/5 R; 200/340; 338/32 H
[58] Field of Search ...................... 338/32 H; 339/199; 200/340, 292, 159 R, 159 A, 5 A, 5 R, 293

[56] References Cited

U.S. PATENT DOCUMENTS

| | | | |
|---|---|---|---|
| 3,826,884 | 7/1974 | Lewandowski | 200/159 R |
| 3,855,439 | 12/1974 | Hermann | 200/159 R |
| 3,858,145 | 12/1974 | Sulich et al. | 338/32 H |
| 4,227,163 | 10/1980 | Barnoski | 200/159 A X |
| 4,251,703 | 2/1981 | Hoeft et al. | 200/340 |
| 4,268,814 | 5/1981 | Henrion et al. | 338/32 H |

FOREIGN PATENT DOCUMENTS

| | | | |
|---|---|---|---|
| 0025629 | 3/1981 | European Pat. Off. | 200/340 |
| 0028000 | 5/1981 | European Pat. Off. | 200/340 |
| 0636717 | 12/1978 | U.S.S.R. | 338/32 H |
| 2046996 | 11/1980 | United Kingdom | 200/340 |

OTHER PUBLICATIONS

IBM Tech. Disc. Bull., vol. 3, No. 6, 11-60, Key Top, Eastwood.

Primary Examiner—Henry J. Recla
Assistant Examiner—Ernest G. Cusick
Attorney, Agent, or Firm—Spencer & Frank

[57] ABSTRACT

In order to have a large flexibility of application with simultaneously a reasonable number of different piece parts for a so called transformer keyboard the key element is subdivided. A base (1) usable for all applications includes elements for the protection against rotation (14) and for fixing (13) it on a printed circuit board (6) without screws and without soldering operations, further elements to guide (18) the stem (2) and to limit its stroke. The stem receives a ferromagnetic core (4) within its guidance (21). The shape and the size of wall portions (2', 22) change in accordance with the desired raster of the keyboard wherein the key element is used. A cap (3) carrying the marking has the same shape for all stems and is connected to the stem in a detatchable manner (27, 33). Due to their small height these key elements are especially suited in applications for data terminal keyboards with an ergonomically good design.

2 Claims, 3 Drawing Sheets

KEY ELEMENT FOR A CONTACTLESS KEYBOARD

The present invention relates to a key element for a contactless keyboard wherein for operating a key the insertion of a ferromagnetic core into key transformer formed on a printed circuit board is needed.

Key elements suitable for a so-called transformer keyboard are commercially available already. E.g. by "Mechanical Enterprises" in Sterling, Va. U.S.A. a key element is manufactured including for each key a key head with character indication, a stem with a ferromagnetic core fixed thereto, a base with stem guide and with a separate space for receiving the core when the key is not operated, and a resetting spring. Upon operation of the key the core is inserted through a bore of the printed circuit board into the transformer formed thereon. The keys are mounted in cut-outs of a blind plate which in turn is fixed to the printed circuit board with the aid of a number of screws penetrating the printed circuit board.

It is clear that the separate guidance of the stem leads to a considerable height of the key row so that it is not well adapted for a keyboard with an ergonomical design as described e.g. in the European Patent Application No. 81810506.6, published under EP No. 0055220 (Frey et al (8-2-2). Further with this key element it is necessary to have different key heads for each raster of keys leading to hardly admissible expenses for tools due to the usual two-color injection moulding for the key head and the character indication. Further there is a certain risk that the core penetrating through the printed circuit board is damaged during service operations.

It is therefore an object of the present invention to provide a key element avoiding the above disadvantages and maintaining the tool and stock costs within reasonable limits.

The key element according to the invention is characterized by comprising a base including elements for the protection against rotation and for fixing the base on the printed circuit board without using tools and in a solderless manner, by comprising a stem connected with the ferromagnetic core and guided within the base, spring means arranged between base and stem for resetting the latter into the rest position, stroke limiting means locking-on when stem and base are assembled, and a cap mountable in the stem, the arrangement being such that the key element can be assembled without the use of tools, that stems of different dimensions may be used with the same base to achieve different key rasters and that caps of different sizes can be mounted on each of the different stems.

With the key element of the present invention different keyboards can be mounted according to the unit box principle and the cap requiring a separate tool for each character has a very simple design.

The invention will be best understood from the following description of an embodiment taken in conjunction with the accompanying drawing in which.

Figure 1:
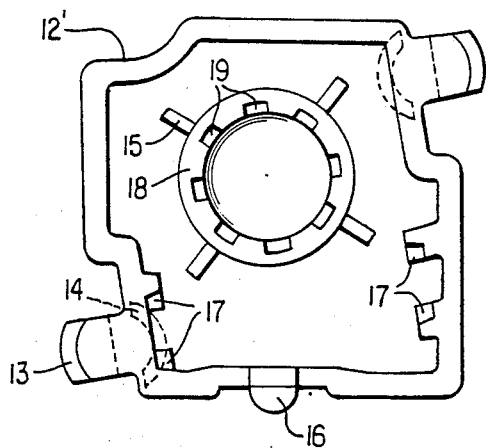
FIG. 1 shows the plan view of the base of the key element.

In connection with FIGS. 1-6 the piece parts of the key element, the assembly of the piece parts and the mounting of the key elements onto a printed circuit board are described in more detail. The key element comprises a base 1, a stem 2, a cap 3, a ferromagnetic core 4 and a spring element 5 or 5'. The piece parts 1, 2 and 3 are made of synthetic material, preferably by injection moulding.

Figure 4:
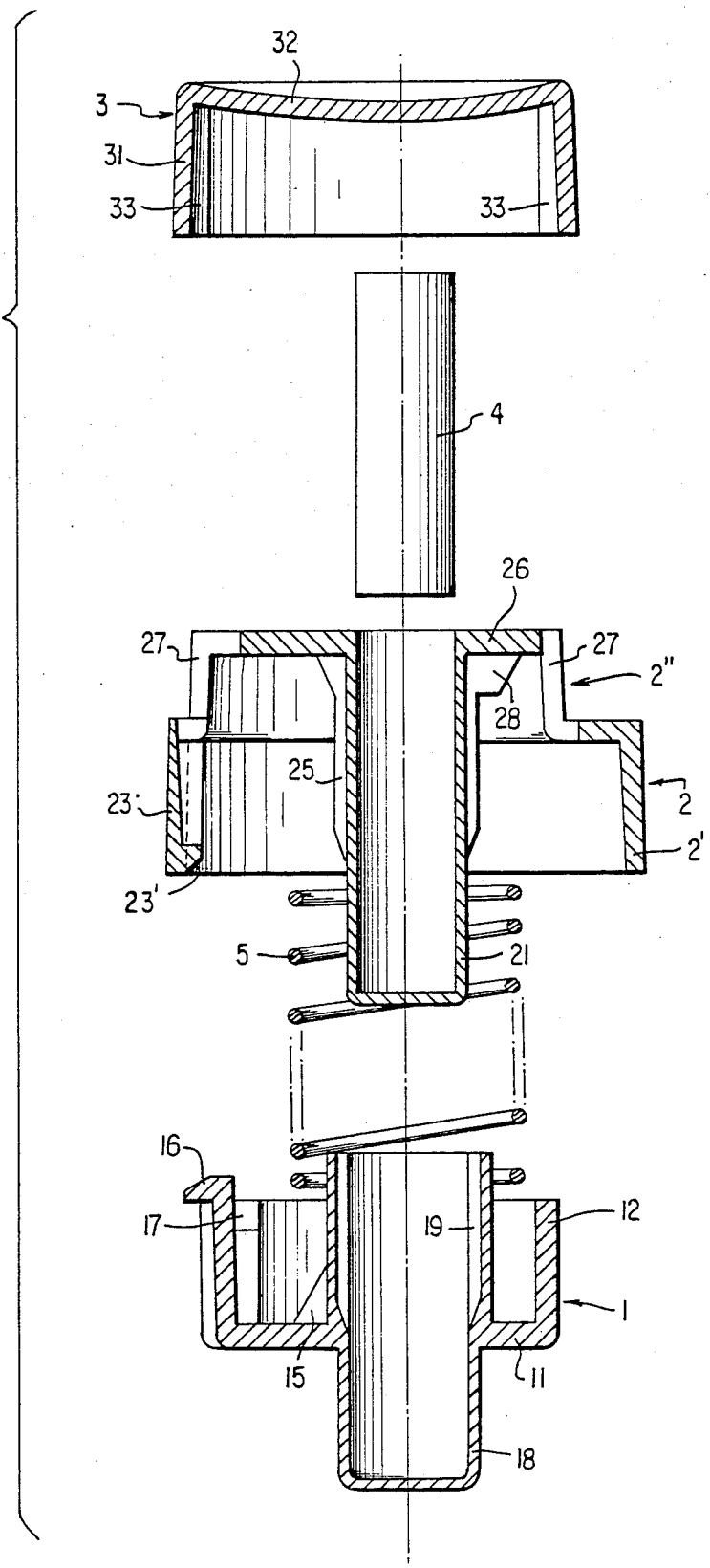
FIG. 4 shows an exploded view of the key element.
Figure 6:
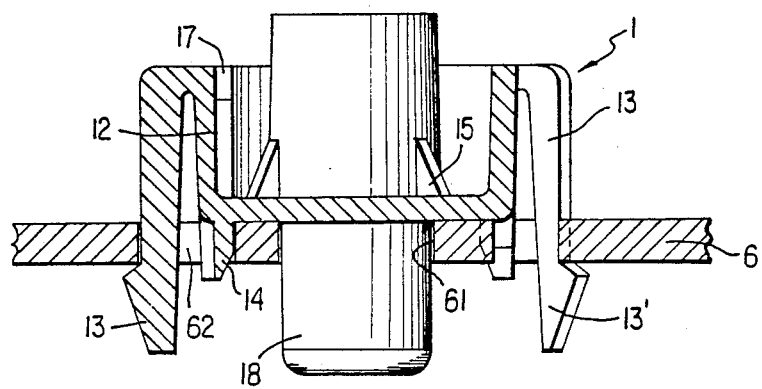
FIG. 6 shows a sectional view of a base according to FIG. 1 mounted on a printed circuit board.

FIG. 1 shows the base 1 in plan view whereas the lowest element of the exploded view of FIG. 4 shows a sectional view of the base and FIG. 6 shows the base with the details of its fixing on a printed circuit board 6. The base 1 consists substantially of a box including walls 12 and having integral with the bottom 11 of the box a cylindric tube 18 the bottom of which is closed. At two diagonally adjacent corners of the box there are two arms 13 integral with the upper end of the walls 12 extending downwards as it can be seen from FIG. 6. Said arms are resilient and extend downwards almost as far as the tube 18. The lower ends of the arms are provided with wedge-shaped enlargements 13' having a slowly sloped front side and steeply sloped rear side.

At the same corner as the arms 13 there are provided at the bottom 11 hollow cylindric projections 14 the lower ends of which are sloped on the convex side. The projections 14 are used to secure the key element fixed into the printed circuit board 6 against rotation. The printed circuit board 6 must be provided with three bores for each key element, namely a bore 61 for the passage of the tube 18 with the ferromagnetic core 4 slidably mounted therein, as it will be described hereinafter, and two bores 62 for the projections 14 the radius of which corresponds to the radius of the bores 62. The resilient arms 13 can be inserted into that portion of the bores 62 not occupied by the projections 14, the slowly sloped front side of their enlargements 13' and the sloped portions of the projections 14 facilitating the insertion of the base or of a key element mounted thereon into the printed circuit board, the steeply sloped rear side of the enlargements 13' being used to fix the key element of the printed circuit board after its insertion and to compensate for the tolerances of the printed circuit board, this fixing being removable without the use of tools.

Thus three bores on the printed circuit board are needed for each key element, both the insertion and the removal of a key element being possible without using tools and without soldering operations.

The tube 18 integral with the bottom 11 of the base 1 extends with a portion with a smooth and thin wall to the lower closed end and with a portion with a thicker wall provided with grooves 19 and with an open upper end to the height of the side walls. The tube 18 is used as a guiding tube for a correspondingly shaped tube 21 of the stem 2 which will be described in connection with the latter.

Figure 5:
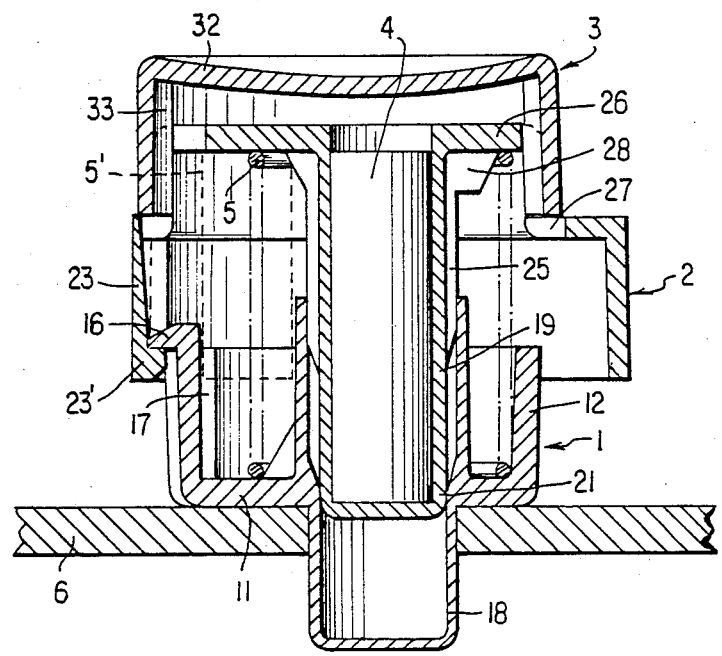
FIG. 5 shows a sectional view of the key element mounted within a printed circuit board.

Equally distanced around the circumference of the tube 18 there are provided four triangle-shaped braces 15 at the bottom of the upper portion of said tube which braces co-operate with similar braces 28 on the lower side of the stem 2 to center a helical spring 5 for resetting the stem, said spring being indicated in FIG. 5 by dashed vertical lines.

At two side walls 12 of the base 1 there are provided two niches 17 used for receiving the ends of a leaf spring 5' for resetting the stem which spring is meander-like-shaped between the niches 17 and the bottom side of the cover 26 of the stem 2 in such a manner that on operating the key there results a pull-off. As it can be seen from FIG. 1 the connection lines between corresponding niches on ajacent walls 12 cross the side walls with an angle different from 90° and the axis of the cylindric tube 18 does not go through the crossing point of the diagonals of the square of base. Due to this off-set there is, on the one hand enough space for the leaf spring, on the other hand from the complementary off-set between stem tube 21 and cap seat 2" shown in FIG. 2 the rest point of the leaf spring 5' on the stem has only a small off-set with respect to the center of the cap.

As it can be seen from above the base is designed both for the reception of a helical spring with a linear displacement vs. force characteristic and for the reception of a leaf spring with a non-linear displacement vs. force characteristic in accordance with the request of the user.

The lowest side wall of base 1 in FIG. 1 has a zone with lower thickness in the middle of which zone a projection 16 is provided extending over wall 12 as it can be seen from FIG. 4. This projection co-operates with a similar projection 23' on an arm 23 of stem 2 to provide an abutment for the backmotion of the stem caused by the resetting spring 5 or 5'. When assembling stem and base the two projections slide on their corresponding sloped surfaces with resilient deformation in order to lock-on, as shown in FIG. 5. By this means the stem and base are connected in a captive, but separable manner.

It can be summarized that the base 1 is a plastic molded piece which contains all elements needed for the guidance and the stroke limitation of the stem, for the insertion and the removal of a key element without tools and without soldering operations and for the reception of resetting springs of different displacement vs. force characteristics. The real size of the square of the base is about 12×12 mm so that the base may be used for key elements having a raster of 15×15 mm or more, the smallest raster being used for so-called management keyboards whereas larger rasters being used for professional keyboards.

Figure 2:
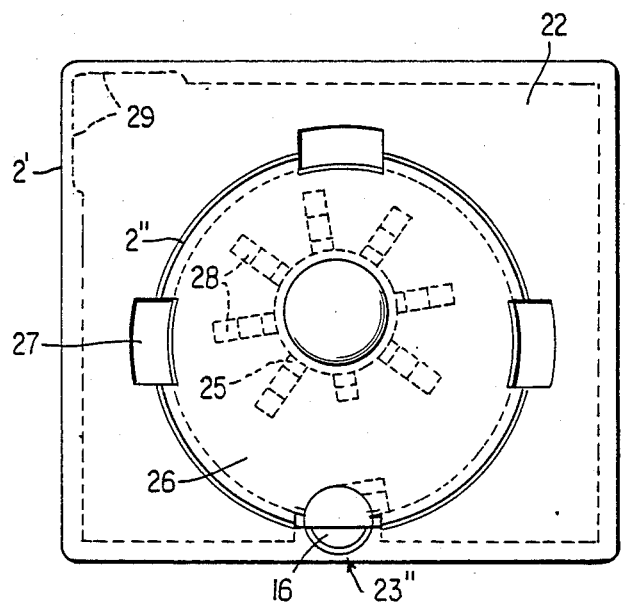
FIG. 2 shows the plan view of the stem of the key element.

FIG. 2 shows the plan view of the stem 2 whereas the middle element of the exploded view of FIG. 4 shows the sectional view of the stem. The stem 2 consists basically of a lower wall portion 2' having a square or rectangular cross-section the size and shape of which are determined by the raster of the keyboard requested by the user, of an intermediate bottom 22, of an upper wall portion 2" with circular plan view, of a cover 26 and of a cylindric tube 21 integral with the latter, the lower end of this tube being closed and its upper end being open.

The upper cylindric wall portion 2" of stem 2 is provided with four recesses 27 equally distanced by 90° used for fixing the cap 3 in four different positions, all said recesses are tightly closed with mounted cap. The different shape of the lowest opening 27 in FIG. 2 has manufacturing reasons which will not be described here. It is obvious that with mounted cap 3 a portion of the intermediate bottom 22 connecting the two wall portions 2' and 2" remains visible, the amount of this visible portion depending on the shape and the size of the lower wall portion 2' depending in turn as already mentioned from the raster of the keyboard wherein the key element is used. By a corresponding choice of the colours of the synthetic material used for the stems a keyboard can be divided into differently coloured zones due to the visible portion of the intermediate bottom, e.g. into zones for alphanumeric keys, numeric keys and function keys. The lower wall portion 2' of stem 2 has such a length that its lower end is in the rest position of the stem lower that the upper end of wall 12 of base 1. With this it can be achieved that the key element with mounted cap 2 is splash-proof as well in the rest position as in the operated position. This has a certain value for a key element which is used e.g. for the keyboard of a data input terminal since it may happen that a liquid is poured over a keyboard.

Integral with the lower side of the cover 26 closing the cylindric wall portion 2" there is provided said cylindric tube 21 the lower end of which is closed. Within this tube the ferromagnetic core 4 is fixed e.g. by heat-forming the upper edge of the tube. Similar to the tube 18 of the base 1 the tube 21 is also provided with a lower portion having a smooth wall of relatively low thickness and with an upper portion with a number of ribs 25 ending near to the cover 26 into triangular struts 28 which are used to center the helical spring 5 as already mentioned. When the key is operated the ribs 25 glide in the grooves 19 of the base and secure the stem against rotation in the base and cause an enforcement of the tube 21. These ribs increase the flow section from the injection point at the bottom of the tube 21 to the side walls 2" and 2'. In addition the clearance between the ribs 25 and the grooves 19 allows that the air can escape from tube 18 when the key is operated.

One corner of the side wall 12 of the base 1 is provided with a groove 12' whereas the thickness of the square or rectangular portion 2' of the side wall 23" of stem 2 is smaller at the position 29, as shown in FIG. 2. This two measures are used together with a not shown bore in the intermediate bottom 22 closed by a translucent cover to provide the possibility to use an LED soldered into the printed circuit board as a signal lamp as it is desired sometimes for special keys.

Due to the subdivision of the tubes 18 and 21 each into a lower portion with a thin wall and a reinforced upper portion there can be achieved that the air gap between the ferromagnetic core 4 and the windings of the key transformer is not larger than with an arrangement known from the state of art in which arrangement the core passes through the printed circuit board, but a relatively large passage bore must be chosen due to production tolerances.

Figure 3:
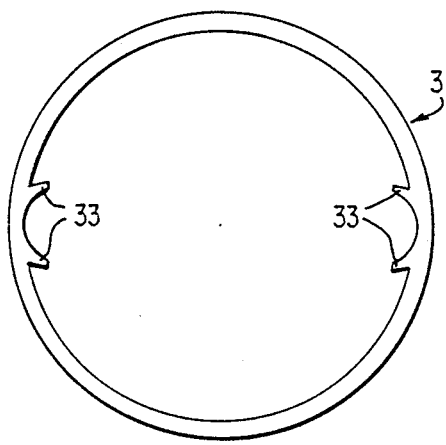
FIG. 3 shows a view from bottom of the cap of the key element.

FIG. 3 shows the cap 3 in a view from bottom whereas in FIGS. 4 and 5 a sectional view of the cap is shown. The cap 3 consists of a plastic moulded piece with a substantially cylindrical wall 31 and a cover 32 designed as a concave or convex finger board. On two opposite inner sides of the wall 31 there are provided two pairs of lip-like projections 33 extending in parallel to the axis of the cylinder and fitting into corresponding recesses 27 of the stem 2 with resilient deformation and being used for fixing the cap on the stem.

The cap can be made of transparent synthetic material. In this case it is possible to insert into the space shown in FIG. 5 between stem and the lower side of the cap a label, particularly for prototype keyboards. For professional keyboards the caps and their labels or characters may be produced preferably by two-color injection moulding. Since with this injection moulding method there is needed for each character a proper tool cavity it is important that the design of this piece part is as simple as possible.

It should now be appreciated that by the present subdivision of the key element into a uniform base containing the elements for centering and fixing the key element on a printed circuit board and for guiding the stem, into a stem with a size depending on the desired keyboard raster and receiving the ferromagnetic core within the guidance, and into a uniform cap with a small number of different tool cavities and with a relatively small number of piece parts to be stocked, a complete family of keyboards can be provided.

Due to their low height the key elements of the present invention are especially adapted for using in flat keyboards of data terminals, text editing systems a.s.o. With this key element there is no problem to remain below the maximum height of 30 mm from the supporting surface of the keyboard for the third row of keys counted from the lower side to fulfil the requirements of DIN 33402.

What is claimed is:

1. A keyswitch element for a contactless keyboard wherein a ferromagnetic core is movably mounted for insertion into a corresponding transformer winding located on a printed circuit board, said keyswitch element comprising:

a box-like base having a cylindrical guiding tube integrally formed therewith and extending downwardly and upwardly from a bottom portion of said base and said cylindrical tube being closed at the lower end thereof, said base including a pair of integral non-resilient projections arranged at diagonally located corners of said base, said projections having the shape of hollow cylinder segments for positioning said base in a pair of bores in said printed circuit board and a pair of integral resilient arms at the same corners extending downwardly for fixing said base onto the said printed circuit board by engaging into the same pair of bores, said guiding tube having, along its internal surface, longitudinally extending guide grooves;

a stem comprising a vertically extending and generally cylindrical ferromagnetic core holder slidably received in said guiding tube and said stem having a horizontal portion at the upper end of said core holder, said core holding having, along its internal surface, longitudinally extending ribs corresponding to and received in said guide grooves of said guiding tube, said stem having a downwardly directed generally rectangular skirt portion having at one sidewall thereof an inwardly directed projection for engaging an outwardly directed projection on said base to limit the movement of said stem away from said base, said stem having an upwardly directed generally cylindrical portion provided with recesses;

a helical spring surrounding said core holder between said horizontal portion of said stem and said bottom portion of said base for yieldably urging said stem away from said base; and a hollow generally cylindrical cap with a closed upper end and provided internally with projections extending parallel to the axis of the cylinder and detachably engaging into said recesses of the stem.

2. The keyswitch according to claim 1, wherein said guiding tube and said core holder each comprise a stepped cylindrical member having a thin wall lower portion and a reinforced upper portion and being dimensioned for telescopic engagement with the other of said guiding tube and said core holder.

* * * * *

UNITED STATES PATENT AND TRADEMARK OFFICE
CERTIFICATE OF CORRECTION

PATENT NO. : 4,791,257

DATED : December 13, 1988

INVENTOR(S) : Werner U. Frey; Johannes Rometsch; Karl Iseli; and Peter Wild.

It is certified that error appears in the above-identified patent and that said Letters Patent is hereby corrected as shown below:

On the Title Page, insert,
    Priority: Swiss Application No. 2282/82-0
                 filed April 15th, 1982

Signed and Sealed this

Second Day of May, 1989

*Attest:*

DONALD J. QUIGG

*Attesting Officer*      *Commissioner of Patents and Trademarks*